(12) United States Patent
Greer et al.

(10) Patent No.: US 8,697,474 B2
(45) Date of Patent: Apr. 15, 2014

(54) METHODS TO FABRICATE AND IMPROVE STAND-ALONE AND INTEGRATED FILTERS

(75) Inventors: Frank Greer, Pasadena, CA (US); Shouleh Nikzad, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 342 days.

(21) Appl. No.: 13/006,209

(22) Filed: Jan. 13, 2011

(65) Prior Publication Data

US 2011/0169119 A1    Jul. 14, 2011

Related U.S. Application Data

(60) Provisional application No. 61/294,763, filed on Jan. 13, 2010.

(51) Int. Cl.
*H01L 21/00* (2006.01)
*H01L 31/0232* (2006.01)

(52) U.S. Cl.
USPC .......... 438/70; 438/57; 438/69; 257/E21.001; 257/E31.127

(58) Field of Classification Search
USPC .................. 438/57; 257/E21.001, E31.127
See application file for complete search history.

(56) References Cited

U.S. PATENT DOCUMENTS

| | | | | |
|---|---|---|---|---|
| 3,744,870 | A * | 7/1973 | Tomiki et al. | 359/359 |
| 7,968,365 | B2 * | 6/2011 | Hiyama et al. | 438/60 |
| 2008/0296640 | A1 * | 12/2008 | Hiyama | 257/291 |
| 2009/0291538 | A1 * | 11/2009 | Mise et al. | 438/216 |
| 2010/0084728 | A1 * | 4/2010 | Yamada | 257/432 |
| 2010/0134735 | A1 * | 6/2010 | Nakamura et al. | 349/116 |

OTHER PUBLICATIONS

Lee, Y. et al., "Atomic layer deposition of aluminum thin films using an alternating supply of trimethylaluminum and a hydrogen plasma," Electrochemical and Solid-State Letters, 5 (10) C91-C93 (2002).
Pilvi, T. et al., "Study of a novel ALD process for depositing $MgF_2$ thin films," J. Mater. Chem., 2007, 17, 5077-5083.

* cited by examiner

*Primary Examiner* — Angel Roman
(74) *Attorney, Agent, or Firm* — Gates & Cooper LLP

(57) ABSTRACT

Embodiments of the invention provide for fabricating a filter, for electromagnetic radiation, in at least three ways, including (1) fabricating integrated thin film filters directly on a detector; (2) fabricating a free standing thin film filter that may be used with a detector; and (3) treating an existing filter to improve the filter's properties.

24 Claims, 19 Drawing Sheets

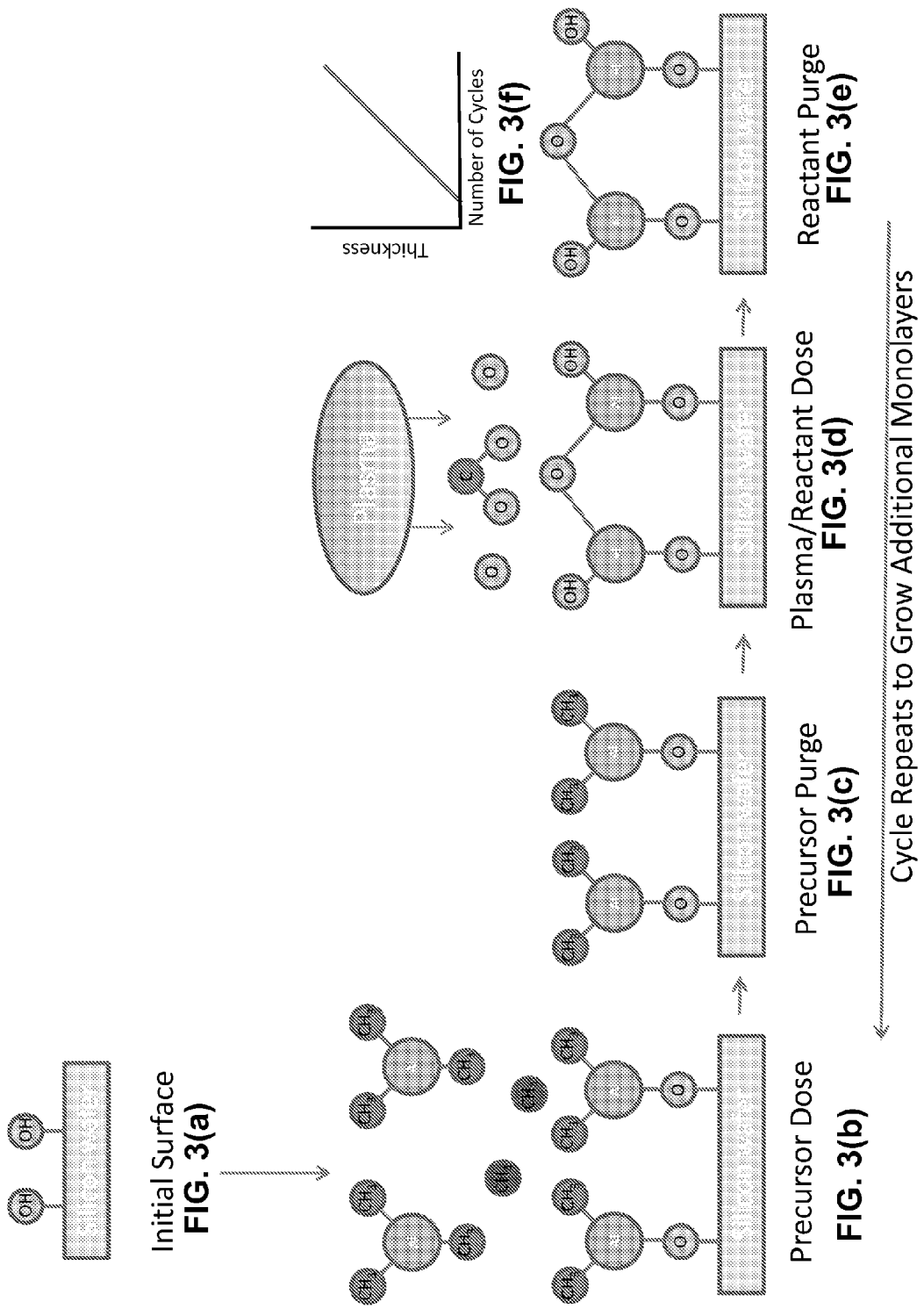

METHODS TO FABRICATE AND IMPROVE STAND-ALONE AND INTEGRATED FILTERS

CROSS REFERENCE TO RELATED APPLICATIONS

This application claims the benefit under 35 U.S.C. Section 119(e) of the following and commonly assigned U.S. Provisional Patent Application:

U.S. Provisional Patent Application Ser. No. 61/294,763 filed on Jan. 13, 2010, by Harold F. Greer, Shouleh Nikzad, Matthew Beasley and Brennan Gantner, entitled "PLASMA TREATMENT TO REMOVE CARBON FROM INDIUM UV FILTERS", which application is incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates generally to imaging, and in particular, to a method apparatus, system, and article of manufacture for imaging astronomical spectral regions.

2. Description of the Related Art

The sounding rocket experiment FIRE (Far-ultraviolet Imaging Rocket Experiment) illustrates the ability to image a spectral region that hitherto has been unexplored astronomically. The imaging band of FIRE (~900-1100 Angstroms (Å) electromagnetic radiation wavelength) helps fill a wavelength imaging observation hole existing from ~620 Å to the GALEX (Galaxy Evolution Explorer™) observed band near 1350 Å wavelength. Demonstration of the usefulness of the FIRE wavelength band provides the ability to develop/conduct space-based missions that can find and study quasars, star forming regions and galaxies and other UV (ultraviolet) bright objects.

Star formation typically produces the hottest, brightest types of stars, O stars, 30,000-50,000° C. The emission peaks of O stars are within the FIRE waveband and constitute a majority of all the observed light emitted at these wavelengths. Therefore, the 900-1100 Å band provides the most sensitive indicator of young, massive stars. Combining this information with UV and visible wavelength data from other missions and comparing the spectral colors to stellar evolution models can help with the determination of the star formation history.

Complicating an accurate determination of the stellar population of young, hot stars is the intervening dust. To determine the quantity of O stars, one must first determine the effect this dust has on the recorded spectrum. The extinction due to dust, however, varies strongly with wavelength in the UV and over differing lines-of-sight. GALEX has previously attempted this measurement and effectively gave two data points corresponding to the two wavelength bands it measured, 1350-1780 Å and 1770-2800 Å. FIRE has similar angular resolution and field-of-view as GALEX and is intended to compliment that mission with the 900-1100 Å measurement. Combined with visible light measurements, this produces four points upon which a dust extinction model can be determined. While this does not uniquely constrain extinction models, it limits the possibilities, allowing more accurate removal of the effects of the intervening dust.

FIRE is a single optic prime focus telescope with a 1.75 m focal length. The bandpass of 900-1100 Å wavelength is set by a combination of the mirror coating, the indium filter in front of the detector and the salt coating on the front of the detector's micro-channel plates. Critical to this is the indium filter that must reduce the flux from Lyman-alpha at 1216 Å by a minimum factor of $10^{-4}$. The cost of this Lyman-alpha removal is that the filter is not fully transparent at the desired wavelengths of 900-1100 Å.

Accordingly, the prior art fails to provide filters that sufficiently remove Lyman-alpha while maintaining sufficient transparency. The above example illustrates the utility of an indium filter for ultraviolet astronomy applications, but it is clear that high quality filters are useful for a variety of imaging applications for a wide variety of regions of the electromagnetic spectrum.

SUMMARY OF THE INVENTION

Embodiments of the invention overcome the problems of the prior art by providing at least three different methods to produce filters for detectors. These methods may apply to all regions of the electromagnetic spectrum including ultraviolet, visible, and infrared regions. These three methods can be described as fabrication of integrated thin film filters on the detector, fabrication of free-standing thin film filters, and treatments to existing filters.

To overcome the limitations in the prior art, and to overcome other limitations that will become apparent upon reading and understanding the present specification, the present invention discloses a method of fabricating a filter for electromagnetic radiation, comprising fabricating the filter on or above a surface of a detector, wherein the detector is a substrate for the fabricating, and the detector is for receiving and detecting the electromagnetic radiation transmitted through the filter ("transmitted radiation").

The fabricating may comprise controlling a thickness of the filter with atomic layer precision, for example.

The fabricating may comprise depositing one or more atomic monolayers of an insulating layer or a barrier layer on the surface; and depositing the filter on the insulating layer and/or barrier layer, for example. The insulating layer or barrier layer may be aluminum oxide and the detector is a silicon imager, for example.

The filter may comprise one or more layers selected from a group consisting of aluminum and magnesium fluoride multilayers, one or more indium layers, and one or more magnesium layers, for example.

The filter may be a film, and the thickness and one or more material qualities of the film may be controlled to improve transparency of the filter at a frequency of the electromagnetic radiation that is transmitted through the filter, for example.

The thickness and the material qualities may be such that the filter reduces a flux of the electromagnetic radiation at Lyman-alpha frequencies by a factor of at least $10^{-4}$, while at least 10% of the electromagnetic radiation having a wavelength between 900 Angstroms and 1100 Angstroms is transmitted through the filter, for example.

The filter may be a film and the fabricating may be under conditions such that a surface of the film for receiving the electromagnetic radiation has a thickness uniformity and thickness accuracy of 5% or less, and a transparency of the film is 10% or greater at one or more frequencies in a pass band of the filter, for example.

The fabricating may comprise depositing the filter by Atomic Layer Deposition (ALD) on or above the surface, for example.

The method may further comprise treating the filter with a plasma to remove undesired contaminants from the filter that reduce transmission at one or more frequencies of the transmitted radiation, for example.

The present invention further discloses a method of fabricating a filter for electromagnetic radiation, comprising depositing a stop layer on a sacrificial substrate, wherein a transparency of the stop layer is 10% or greater at one or more frequencies in a pass band of the filter; depositing filter material on or above the stop layer; and at least partially removing the sacrificial substrate up to the stop layer to form the filter, so that one or more thicknesses of one or more regions of the filter are sufficient to support the filter.

The sacrificial substrate may be formed into a mesh or perimeter supporting the filter in the free-standing form, for example.

The present invention further discloses a method for treating a fabricated filter for electromagnetic radiation comprising treating the fabricated filter with one or more plasmas to improve one or more of the fabricated filter's properties. The treating may remove one or more undesired contaminants from the filter that reduce transmission at one or more frequencies of the electromagnetic radiation transmitted through the filter, for example. The treating may increase transmission at one or more frequencies of the electromagnetic radiation transmitted through the filter, for example.

BRIEF DESCRIPTION OF THE DRAWINGS

Referring now to the drawings in which like reference numbers represent corresponding parts throughout:

FIGS. 3(a)-3(f) illustrate the ALD process and plasma treatment in accordance with one or more embodiments of the invention;

DETAILED DESCRIPTION OF THE INVENTION

Figure 1:
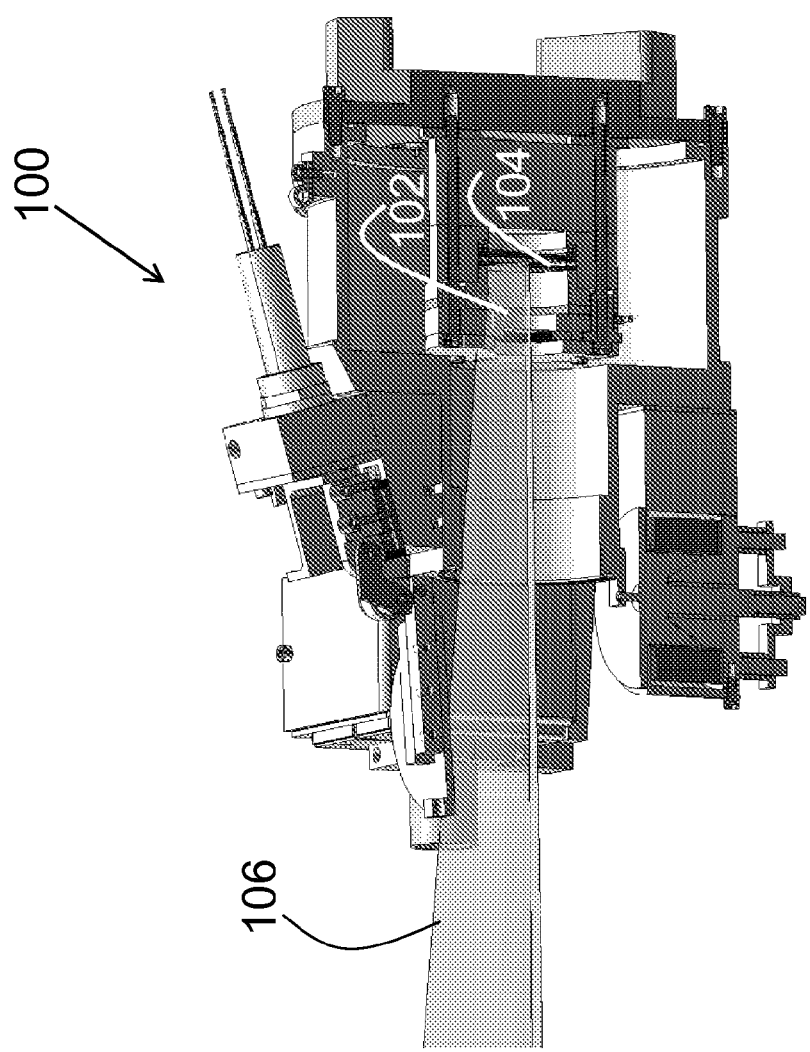
FIG. 1 illustrates a cutaway view of a detector assembly for the FIRE telescope, including a filter.

In the following description of the preferred embodiment, reference is made to the accompanying drawings which form a part hereof, and in which is shown by way of illustration a specific embodiment in which the invention may be practiced.

It is to be understood that other embodiments may be utilized and structural changes may be made without departing from the scope of the present invention.

Overview

Embodiments of the invention provide at least three different methods to produce filters for detectors. These methods may apply to all regions of the electromagnetic spectrum, including the ultraviolet, visible, and infrared regions. These three methods can be described as fabrication of integrated thin film filters on the detector, fabrication of free-standing thin film filters, and treatments to existing filters.

Thin films of certain metals, oxides, fluorides, nitrides, carbides, and combinations thereof have desirable optical properties, enabling the transmission some wavelengths of light, while precluding others from being transmitted. By carefully controlling the material choice(s), the thickness, and arrangement of the layers of these thin films, one can precisely tailor the wavelength range of the transmitted light. This has important applications in many different imaging applications including astronomy, planetary science, and defense. For example, the silicon detectors that are used in ultraviolet (UV) astronomy are sensitive to a phenomenon called "red-leak" where photons at longer wavelengths can be misinterpreted as shorter wavelength photons. This is highly undesirable because UV sources are often faint, so it is critical to have a highly efficient filter that completely eliminates the longer wavelength photons while still maintaining the highest possible transmission for the UV light. The performance of a filter is dependent on several factors related both to film quality and the control over the thickness of the thin film(s) that are deposited. Some examples of film quality parameters include impurity concentration, density, phase, stochiometry, and index of refraction.

Multilayer thin film filters have been previously demonstrated for ultraviolet and visible optical applications. However, these coatings have previously only been grown on transparent substrates and the entire assembly (coating plus substrate) used as a standalone optical element. There are significant disadvantages to this approach. First, most substrate materials are not perfectly transparent, which results in a reduction of the efficiency of the entire optical system. Some wavelengths ranges, in particular, are very challenging because nearly all materials are extremely absorptive (>90% or more). Second, optical quality substrates for those materials that have better transmission can be extremely expensive. Third, standalone filter elements add components, and therefore, complexity to an optical system.

Technical Description

As described above, embodiments of the invention provide for utilizing/growing/producing a filter (e.g., for a detector) in at least three ways: (1) fabricating integrated thin film filters directly on the detector; (2) fabricating a free standing thin film filter (e.g., that may be used with a detector); and (3) treating an existing filter.

Whether a the filter is integrated/grown/deposited directly on the detector, a variety of fabrication techniques may be utilized. This is also true for the fabrication of free standing filters. However, in both cases, the employed technique needs to have the ability to control the thickness of the deposition layers as precisely as possible. Such control is particularly useful in the case of free-standing filters to enable the transparency for the filter to be maximized while also producing useful etch stop layers (i.e., the ability to fabricate/deposit transparent etch stop layers). One fabrication method that may be utilized to control deposition layer thickness is ALD (atomic layer deposition). To better understand the invention, a description of a detector that can be used in both the above embodiments, as well as a description of the above embodiments is useful.

Exemplary Filter Application

FIG. 1 illustrates a cutaway view of the detector assembly and filter for a telescope (e.g., FIRE) in accordance with one or more embodiments of the invention. The detector assembly and filter system 100 includes an indium filter 102 that sits just in front of the detector plates 104, wherein a light beam 106 illuminates the filter 102 and detector 104.

Figure 2:
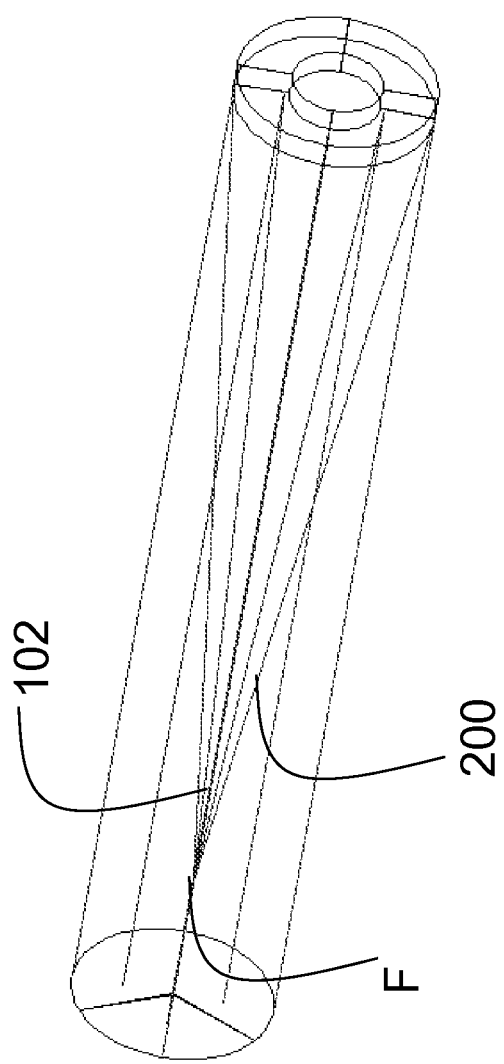
FIG. 2 illustrates a ray trace (e.g., from Zemax™ development corporation) of an optical system used in/with the detector assembly of FIG. 1, showing the position of the filter, in accordance with one or more embodiments of the invention.

FIG. 2 illustrates a ray trace (e.g., from Zemax™ development corporation) of an optical system used in/with the detector assembly 100 of FIG. 1 in accordance with one or more embodiments of the invention. The filter 102 sits one (1) inch in front of the focal point F indicated by the convergence of light rays 200.

As described above, such a filter 102 may be integrated with the detector 104 by being grown directly on the detector 104. Alternatively, a free-standing filter 102 may be grown and used with the detector 104.

Atomic Layer Deposition (ALD) Overview

As described above, using any of the three methods, the thickness of the deposition layers should be controlled (e.g., to enable a transparent etch stop layer or particular transparency for the filter). While many methods may be used to control such a thickness, ALD may be used in accordance with one or more embodiments of the invention. ALD provides the ability to control various properties of the deposition layers including the thickness, the composition, uniformity, density, and stoichiometry with fewer impurities than other existing techniques.

ALD and plasma treatment processes (e.g., as part or in place of the ALD) may be used to enable high performance materials, detectors, and instruments. To better understand such embodiments, a description of ALD is useful.

ALD is a thin film deposition technique that is based on the sequential use of a gas phase chemical process. In ALD, two chemicals, referred to as precursors, react with a surface one at a time in a sequential manner. The thin film is deposited based on the repeated exposure of the precursors to the growth surface. In other words, ALD is a surface reaction mediated deposition where ALD cycles are repeated until a desired film thickness is achieved.

Metals, nitrides, and oxides may be achieved by choosing and utilizing specific precursors and reactant species. Further, using ALD, thin film deposition or surface modifications can be achieved at or near room temperature.

FIGS. 3(a)-3(f) illustrate the ALD process in a reaction chamber of an ALD reactor, in accordance with one or more embodiments of the invention.

FIG. 3(a) illustrates a substrate (e.g., a silicon wafer or detector) that is utilized as an initial surface with hydroxide (OH). The silicon surface typically has this hydroxyl layer after exposure to atmosphere.

FIG. 3(b) illustrates depositing a first layer (e.g., of filter material) on the substrate formed in FIG. 3(a), by reacting a precursor dose of a first precursor (e.g., a methyl such as Trimethylaluminum) with the initial surface of the silicon wafer formed in the step of FIG. 3(a). Methane [CH4] is released as a part of this reaction.

FIG. 3(c) illustrates the first precursor purge (i.e., of the reaction chamber) to remove the non-reacted first precursors and reaction by-products formed in the step of FIG. 3(b).

FIG. 3(d) illustrates a treatment to activate the surface again for the reaction of the first precursor. In this regard, the treatment includes applying a plasma (e.g., carbon dioxide, oxygen, or hydrogen plasma) or other reactant dose to the surface of the filter material or first layer formed in the step of FIG. 3(c), to remove undesired contaminants from the filter material that reduce transmission at one or more frequencies of the electromagnetic radiation transmitted through the filter material. The step may take place in the reaction chamber of the ALD reactor.

FIG. 3(e) illustrates a second reactant purge/evacuation of the reaction chamber where the reactant/plasma is purged/evacuated.

The steps of FIG. 3(b) through 3(e) may be repeated to grow additional monolayers.

FIG. 3(f) illustrates how the thickness of the layers increases (e.g., linearly) as the number of cycles of FIG. 3(b)-3(e) are repeated.

Figure 3G:
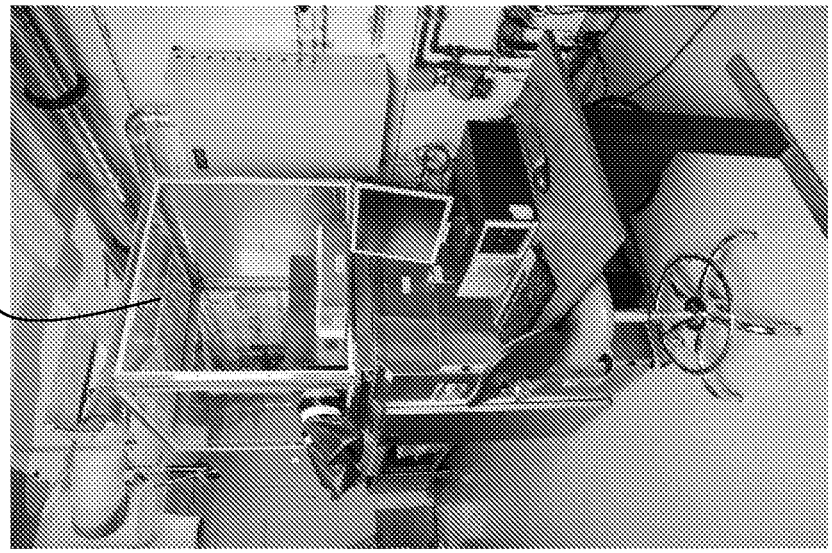
FIG. 3(g) illustrates an ALD system comprising reactor chamber provided by Oxford Instruments™, for use in one or more embodiments of the present invention.

FIG. 3(g) illustrates an ALD system comprising reactor chamber 300 provided by Oxford Instruments™, for use in one or more embodiments of the present invention.

ALD Film Properties

Figure 4B:
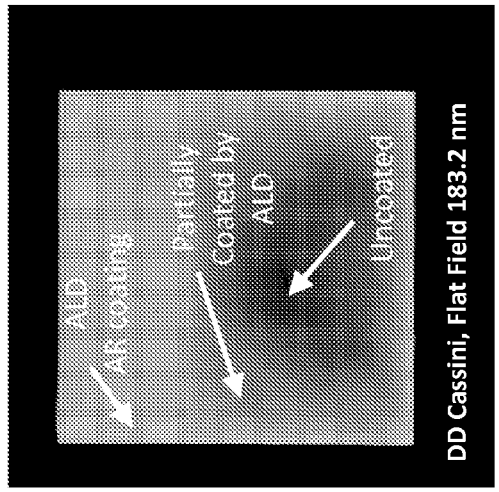
FIG. 4(b) illustrates the flat field image of obtained from a silicon detector (a delta-doped Charge Coupled Device (CCD) utilized in UV astronomy) coated with various amounts of an ALD coating, in accordance with one or more embodiments of the invention.
Figure 4A:
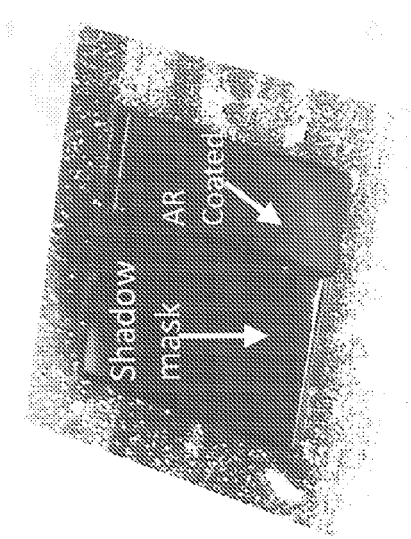
FIG. 4(a) shows the top surface of a silicon detector partially coated with a shadow mask that allows partial coating of the silicon detector with an ALD coating to provide an internal, uncoated reference, to demonstrate the performance of the coating, according to one or more embodiments of the invention.
Figure 4C:
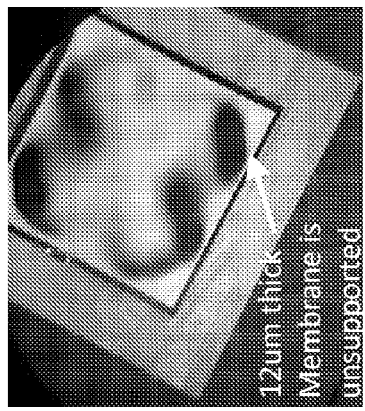
FIG. 4(c) shows the top surface of an delta-doped CCD prior to ALD coating, fabricated into a 12 micrometer thick membrane, in accordance with one or more embodiments of the present invention.

FIGS. 4(a)-4(c) further illustrate ALD in an implementation of ALD coatings for UV astronomy in accordance with one or more embodiments of the invention.

In FIG. 4(a), ALD coatings are used to control the quantum efficiency (QE) of silicon detectors. Many different materials are needed for UV detection due to differences in the wavelength dependence of their adsorption. FIG. 4(b) illustrates an image taken with a silicon detector having an ALD coating, showing a region of the silicon detector having an ALD grown coating, a region of the detector partially coated with an ALD grown coating, and uncoated region of the silicon detector. As the surface of the detector progresses from being uncoated to a complete ALD coating, the brightness of the image on the detector increases. Brighter images indicate a higher QE for the detector.

FIG. 4(a) illustrates the utilization of a shadow mask to create an internal standard for an ALD coated silicon imager. Shadow masking is somewhat difficult due to the conformality of the ALD coating process. In this regard, the shadow mask illustrated in FIG. 4(a) may not sit flat on an unsupported membrane such as that of FIG. 4(c), leading to the bright and dark regions in FIG. 4(c).

Figure 5:
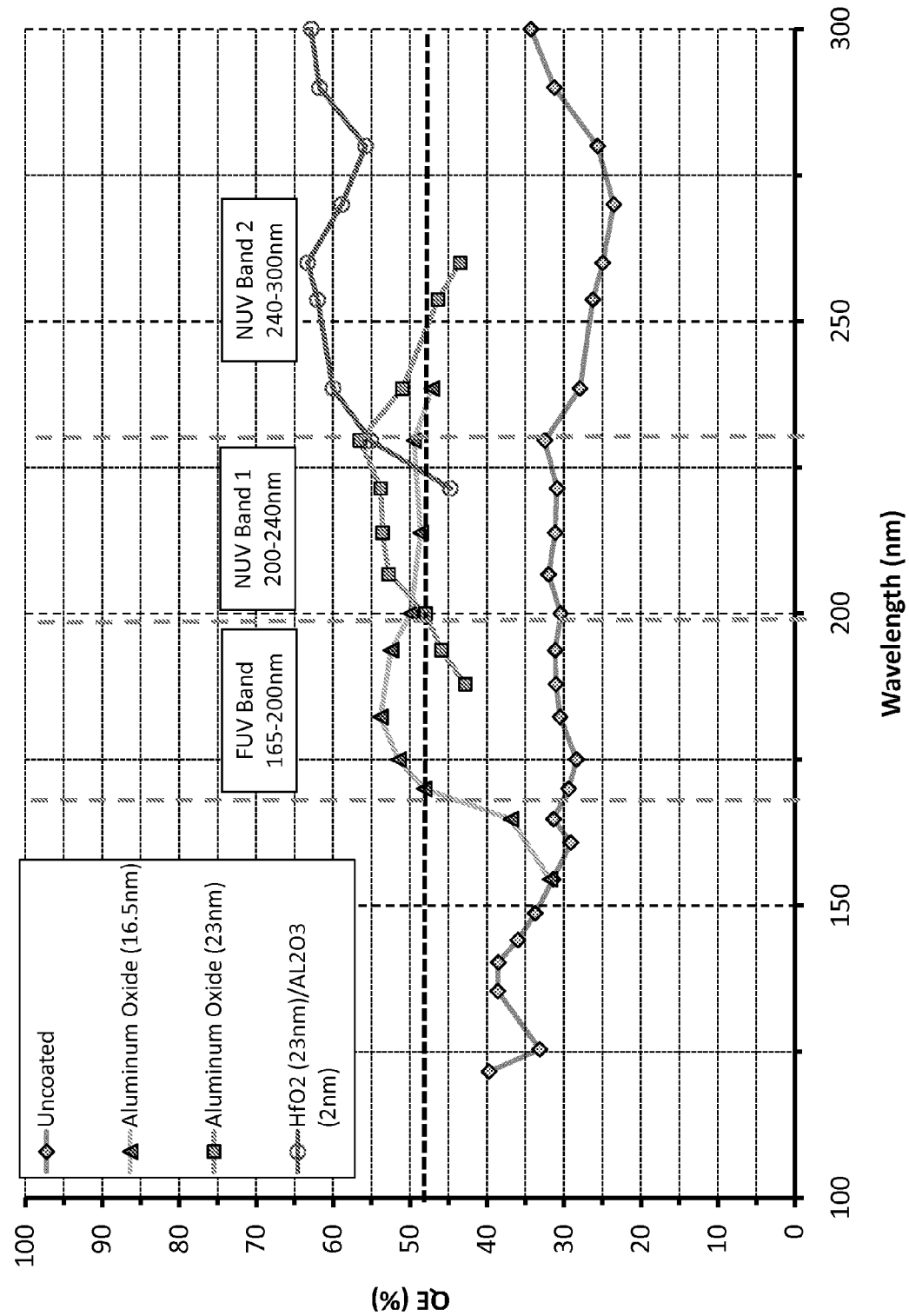
FIG. 5 plots quantum efficiency (QE %) as a function of wavelength (nm) of electromagnetic radiation incident on various ALD coatings deposited on a silicon detector by ALD, illustrating that different thicknesses of ALD deposited coatings alter the silicon imager sensitivity at different wavelengths, in accordance with one or more embodiments of the invention.

FIG. 5 illustrates that atomic layer deposition coatings provide up to a two times (2×) improvement in QE over uncoated baseline and the UV sensitivity as a function of wavelength depends strongly on the type of coating and the coating thickness, in accordance with one or more embodiments of the invention. More specifically, FIG. 5 illustrates the QE of FUV-NUV bands (far and near ultraviolet bands—ranging from about 125 nm to 300 nm wavelength of electromagnetic radiation) using a variety of UV detectors that are uncoated (diamonds), delta doped, and have partial ALD AR coatings (16.5 nm thick Aluminum Oxide (triangles), 23 nm thick Aluminum Oxide (squares), and 23 nm thick $HFO_2$ and 2 nm thick $Al_2O_3$ multilayer (circle).

Figure 6:
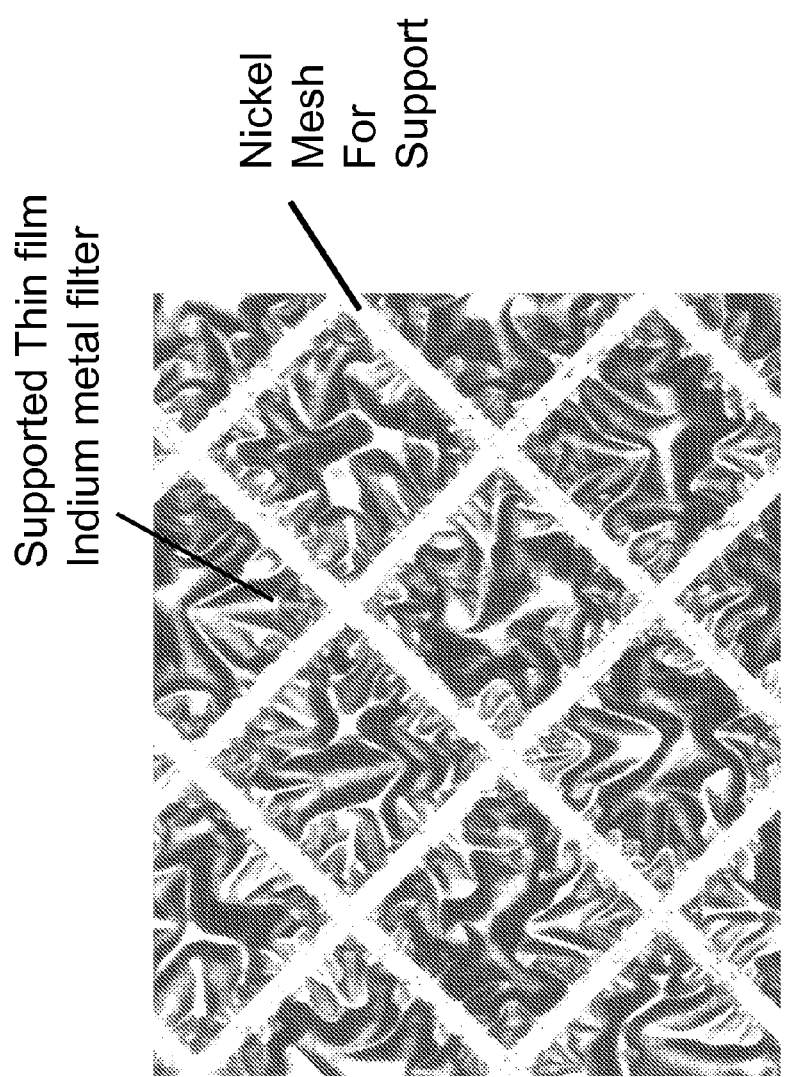
FIG. 6 illustrates a thin indium foil (0.1 microns thick) supported by Ni mesh that can act as a UV filter cutting off transmission above 1100 Å wavelength when used in a FIRE telescope of FIG. 1, in accordance with one or more embodiments of the invention.

FIG. 6 illustrates a thin film indium metal foil (0.1 microns thick) filter supported by Ni mesh that can act as a UV filter cutting off transmission above 1100 Å wavelength when used in a FIRE telescope and detector assembly of FIG. 1. As described above, the FIRE telescope objective may be used to image the very hottest stars, with no interference from Lyman alpha.

Plasma Treatment Experimental Results

In one or more embodiments, the present invention targets a filter that is ~2000 Å thick, as necessary to achieve the desired Lyman-alpha blockage. At that thickness, the present invention may result in a transmission of ~14% at 900 Å wavelength. However, the current "state-of-the-art" filters range in transmission from 4-8% at 900 Å wavelength due to carbon contamination issues. By improving the filter range transmission (from the prior art limitations) to 10% or better, the science return of this type of sounding rocket is substantially enhanced.

Figure 7A:
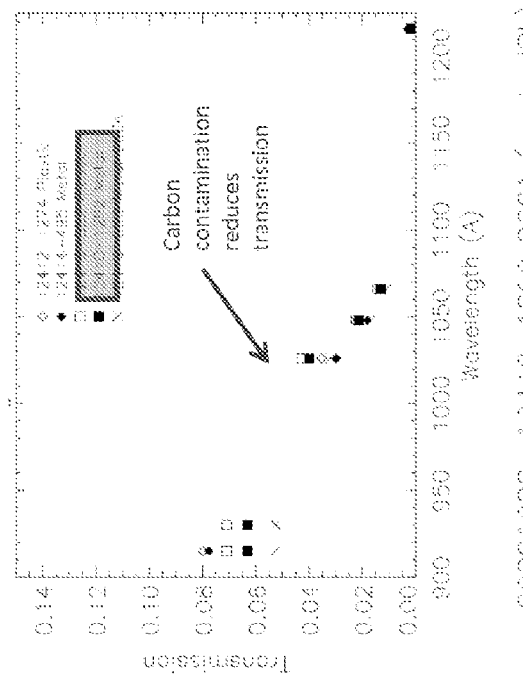
FIG. 7(a) is a chart plotting transmission of a free standing indium filter, without plasma treatment, illustrating the amount by which carbon contamination of filters degrades performance in accordance with one or more embodiments of the invention.

As illustrated in FIG. 7(a), carbon contamination of filters can significantly degrade performance and traditional cleaning may not be used with such a filter design. FIG. 7(a) plots the transmission, through Indium filters, of electromagnetic radiation as a function of the electromagnetic radiation's wavelength (Angstroms, A), wherein the hollow diamonds, solid diamonds, hollow squares, solid squares, and crosses in FIG. 7(a) represent data for Indium filters with different amounts of carbon contamination.

Figure 7B:
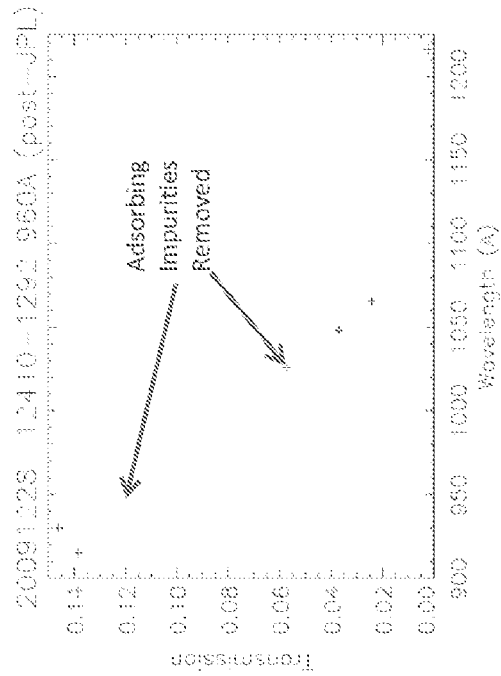
FIG. 7(b) is a chart plotting transmission of a free standing indium filter, illustrating how plasma treatments of embodiments of the invention can be used to improve filter transmission.

However, FIG. 7(b) illustrates that using treatments of embodiments of the invention, significant (e.g., 2×) improvement may be yielded in filter transmission where adsorbing impurities are removed. Specifically, the data in FIG. 7(b) shows the transmission of the Indium filter represented by solid squares in FIG. 7(a), after the Indium filter represented by solid squares in FIG. 7(a) has been treated using a plasma process of the present invention.

In this regard, a gentle, low-temperature process of embodiments of the invention may result in no degradation in the kill ratio for Lyman-alpha while the indium filter integrity is maintained.

Thus, to improve the performance of optical and solar blind detectors, a plasma process may be used to remove carbon contamination from indium metal. A low power, low temperature hydrogen plasma reacts with the carbon contaminants in the indium to form methane, but leaves the indium metal surface undisturbed. Such a plasma process was tested with one of these "state-of-the-art" filters (e.g., provided by University of Colorado™). This initial test was extremely encouraging as a test filter that showed improvement from 7% to 9% near 900 Å wavelength with no process optimization applied.

Figure 8B:
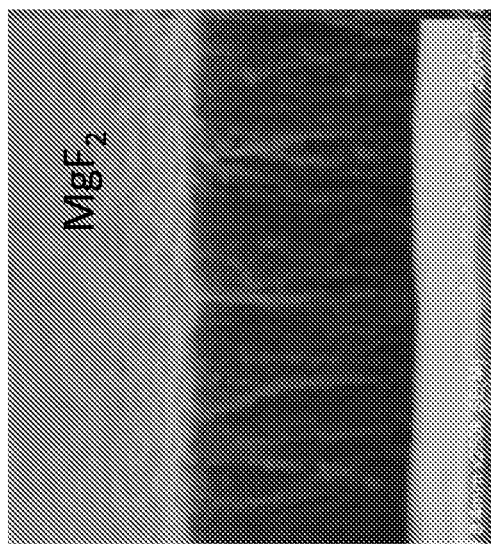
FIG. 8(a) is an SEM image of an Al film deposited on silicon by ALD, wherein the scale is 100 nm, and 8(b) is an SEM image of an $MgF_2$ film deposited on silicon by ALD, in accordance with one or more embodiments of the invention.
Figure 8A:
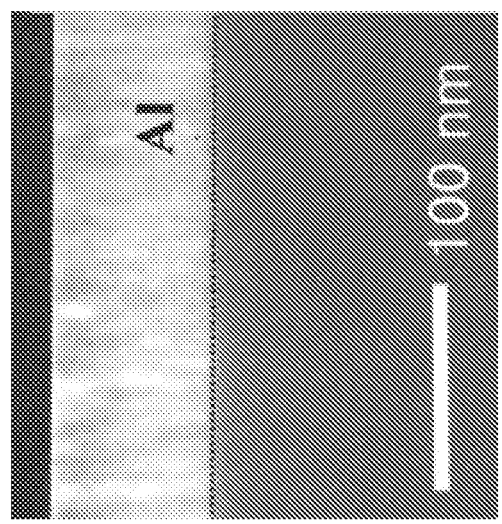

FIG. 8(a) is a SEM image of an Al film deposited on silicon by ALD, wherein the scale is 100 nm, and 8(b) is a SEM image of an $MgF_2$ film deposited on silicon by ALD, in accordance with one or more embodiments of the invention;

Process Steps for Fabricating or Growing an Integrated Filter (Integrated on a Detector)

Figure 9:
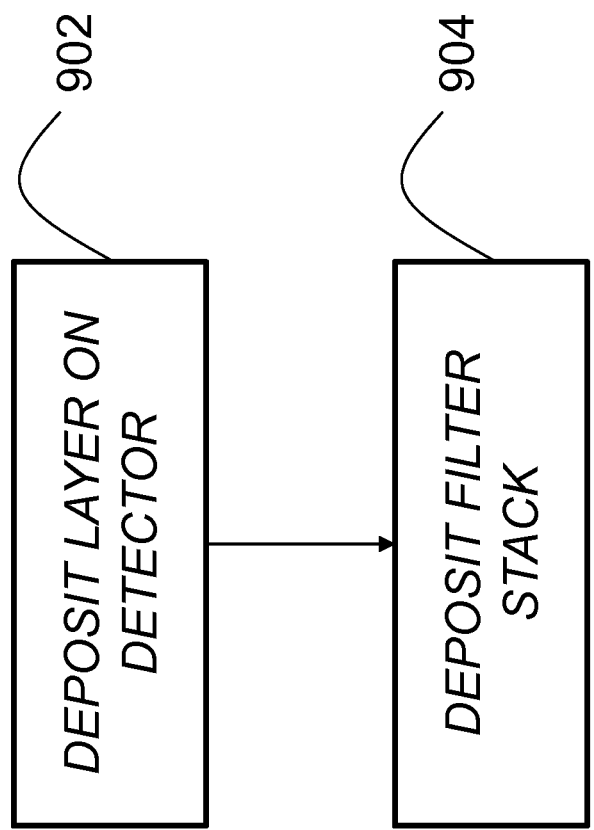
FIG. 9 is a flow chart illustrating an example of fabricating integrated thin film filters on a detector in accordance with one or more embodiments of the invention.

As described above, embodiments of the invention may fabricate integrated thin film filters (e.g., grown directly) on a detector. ALD (or a deposition technique that also produces high quality thin films with high thickness accuracy and uniformity over large surface areas) can be utilized to grow multilayer film stacks directly on a detector. FIG. 9 is a flow chart illustrating an example of fabricating integrated thin film filters on a (e.g., surface of a) detector in accordance with one or more embodiments of the invention, wherein the detector is a substrate for the fabricating.

At step 902, an atomically thin insulating or barrier layer (e.g., 10 angstroms thick aluminum oxide deposited at 300° C. using aluminum precursor and ozone) is deposited on the detector (e.g., silicon imager). The step may comprise depositing one or more atomic monolayers of the insulating layer or barrier layer on the surface of the detector. The insulating layer may prevent an electrical short between the detector and the filter material, for example. The barrier layer (e.g., nitride material) may prevent the filter material from reacting with the detector material, for example. For example, the barrier layer may prevent the filter material from etching the detector.

At step 904, a filter (e.g., filter stack) is deposited, e.g., on the insulator and/or barrier layer. For example, using ALD, Aluminum and Magnesium Fluoride multilayers may be deposited at 250° C. using aluminum precursor and hydrogen for the Al, and a deposition temperature of 350° C. using magnesium precursor and fluorine precursor for the $MgF_2$. Alternatively, the filter may comprise one or more indium layers (deposited, e.g., a 200° C. using indium precursor, ozone, then hydrogen), or one or more magnesium layers (deposited, e.g., at 350° C. using magnesium precursor and hydrogen).

Other potential deposition techniques, besides ALD, that could also be used to deposit thin film filters are molecular beam epitaxy and thermal evaporation, but are not limited to these.

The depositing step may comprise controlling a thickness of the filter with atomic layer precision. The depositing step may deposit the filter as a film, wherein the thickness and one or more material qualities of the film are controlled to improve transparency of the filter at a frequency of the electromagnetic radiation that is transmitted through the filter.

The depositing of the filter is typically under conditions that do not deteriorate or destroy the detector (e.g., depositing the filter below a maximum temperature that depends on the detector).

Figure 10A:
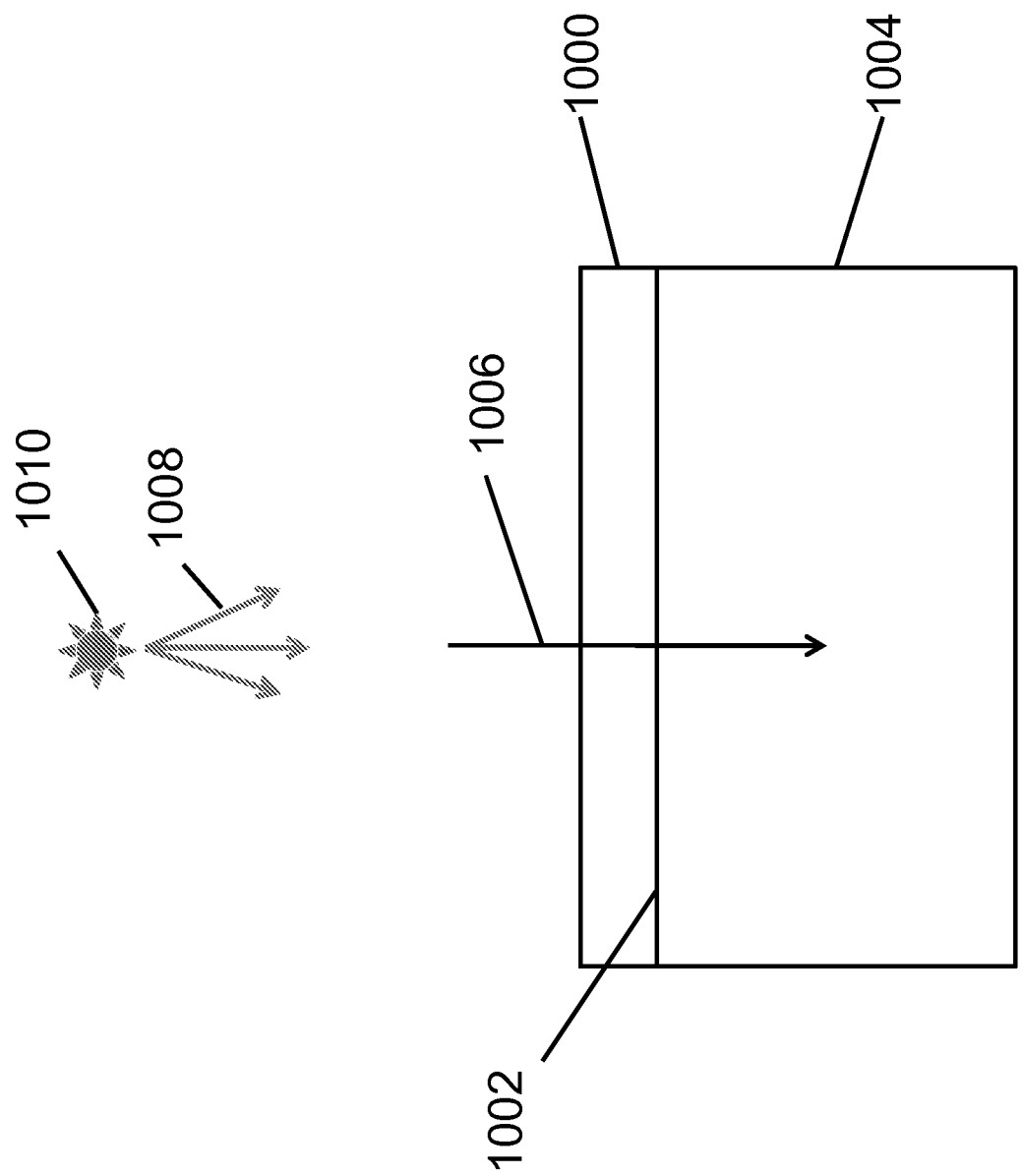
FIG. 10(a) is a cross-sectional schematic of an integrated filter on a detector, according to one or more embodiments of the present invention.

FIG. 10(a) illustrates the end result of the method, a filter for electromagnetic radiation, comprising the filter 1000 fabricated on or above a surface 1002 of a detector 1004 (e.g., the filter 1000 is chemically bonded, atomically bonded, or monolithically integrated with the detector 1004), wherein the detector 1004 is a substrate for the filter 1000, the surface 1002 and detector 1004 is for receiving and detecting the electromagnetic radiation 1006 transmitted through the filter ("transmitted radiation"), the detector and filter illuminated with illumination from 1008 from source 1010.

There may be intermediate layers between the detector 1004 or surface 1002 and the filter 1000, as desired. For example, an insulating layer (e.g., one or more atomic monolayers, or 10 Angstroms thick) and/or a barrier may be on the surface 1002; and the filter 1000 may be deposited on the insulating layer. The insulating layer may be aluminum oxide and the detector may be a silicon imager.

Alternatively, the filter 1000 may be deposited directly on the surface 1002.

A thickness of the filter 1000 may be controlled with atomic layer precision during fabrication of the filter 1000. The thickness may be less than 500 Angstroms, for example. The filter may be a film, or one or more films, and the fabricating may be under conditions such that a surface of the film for receiving the electromagnetic radiation is conformal to the surface of the detector (e.g., over the entire sensing area of the detector). Material properties of the film may be uniform over the entire sensing area of the detector (e.g., thickness uniformity, thickness accuracy, density variations are <2%). The fabricating may be under conditions such that the film or films have a thickness uniformity and thickness accuracy of 5% or less. A transparency of the film or films may be 10% or greater (i.e., the filter transmits 10% or greater of the electromagnetic radiation) at one or more frequencies of a pass band or desired wavelengths of the filter—i.e., if the filter is designed to pass or transmit a first range of frequencies or wavelengths of the electromagnetic radiation, and block a second range of frequencies or wavelengths of the electromagnetic radiation, the filter has a transparency of 10% or more at one or more frequencies or wavelengths in the first range.

The filter may comprise one or more layers selected from a group comprising aluminum and magnesium fluoride multilayers, one or more indium layers, and one or more magnesium layers, for example.

The filter may be a film having a thickness and one or more material qualities such that the filter reduces a flux of the electromagnetic radiation at Lyman-alpha frequencies by a factor of at least $10^{-4}$, while at least 10% of the electromagnetic radiation having a wavelength between 900 Angstroms and 1100 Angstroms is transmitted through the filter.

The deposition may control a material quality of the filter, e.g., one or more of a density, impurity concentration, phase, stochiometry, index of refraction, and composition, to obtain desired optical properties (e.g., transmission) of the filter.

Figure 10B:
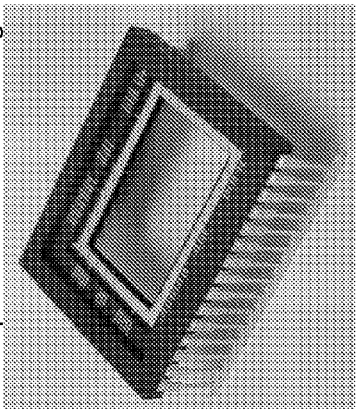
FIG. 10(b) is a photograph of a picture frame package for a detector, for use in one or more embodiments of the present invention.

FIG. 10(b) illustrates a picture frame package for a detector 1004, wherein the detector is an electron multiplied CCD (Charge Coupled Device) Silicon imager, wherein a top side of the package has electrical wiring and the bottom side of the package is for illumination.

Figure 10C:
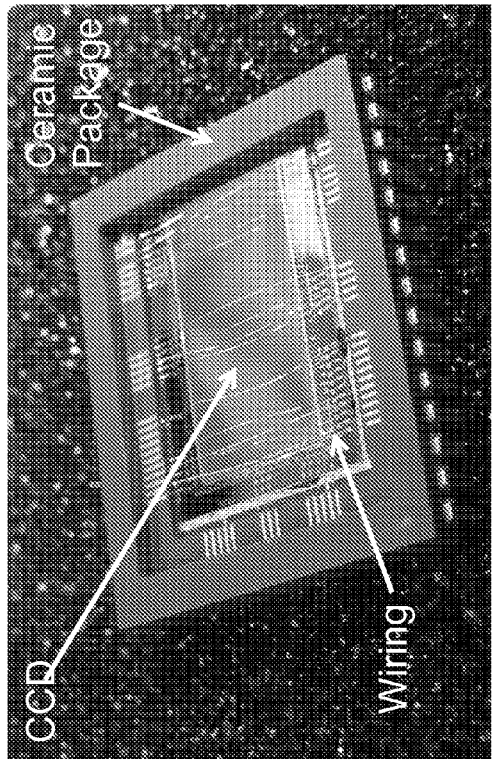
FIG. 10(c) is a photograph of the top of the packaged CCD Silicon imager, showing the CCD, ceramic package, and electrical wiring, for use in one or more embodiments of the present invention.

FIG. 10(c) illustrates the top of the packaged CCD Silicon imager, showing the CCD, ceramic package, and electrical wiring.

Figure 10D:
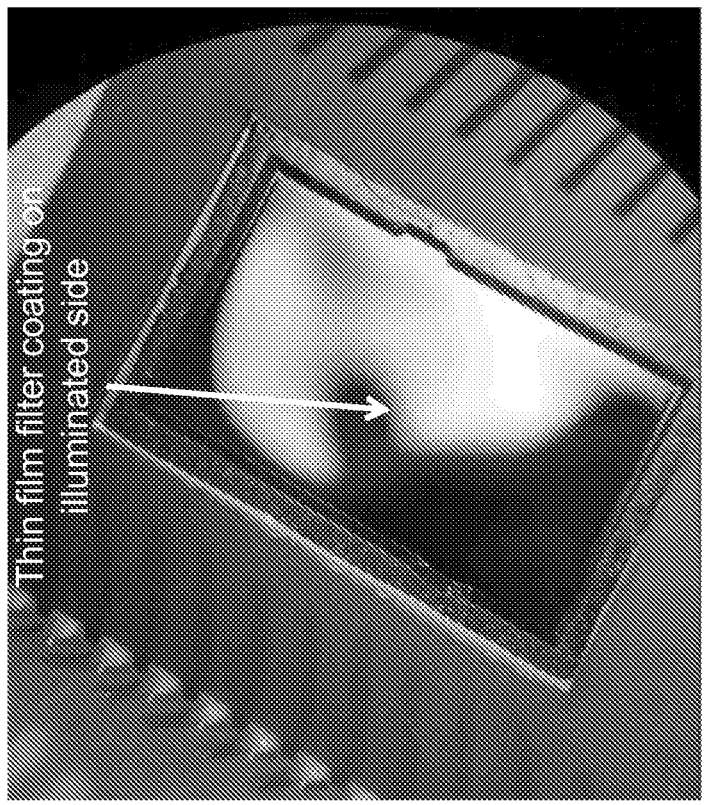
FIG. 10(d) is a photograph of the bottom side of the packaged CCD, showing the thin film filter coating integrated on the illuminated side of the packaged CCD; according to one or more embodiments of the present invention.

FIG. 10(d) illustrates the bottom side of the packaged CCD, showing the thin film filter coating integrated on the illuminated side of the packaged CCD.

Process Steps for Fabricating a Free-Standing Filter

Some detectors do not readily lend themselves to deposition of integrated filters. In particular, certain imaging applications require microchannel plates (MCPs). These MCP detectors are designed to work in combination with a photocathode material that, under illumination, produces free electrons that are multiplied and detected by the MCP. An integrated filter based on a film stack deposited on the photocathode could result in the disruption of the production of these free electrons. This could happen by altering the work function of the photocathode. Therefore, for those cases, it is necessary to have the filter be a separate component in the optical system. It should be noted that a thin film filter can be directly integrated with a photocathode, in one or more embodiments of the invention.

ALD (or a deposition technique that also produces high quality thin films with high thickness accuracy and uniformity over arbitrarily large surface areas) can be utilized to grow multilayer film stacks. As mentioned previously, ALD and other techniques have been used to grown thin film filters, but only on semi-transparent substrates. Embodiments of the invention employ a sacrificial substrate as the growth template. After the filter growth, the sacrificial substrate is at least partially removed by etching, liftoff, or other suitable methods. If required, certain portions of the sacrificial substrate can be maintained as a support for the free-standing filter film stack (to avoid the disadvantages of an unsupported membrane as described above with respect to FIGS. 4(b)-4(c)). That support could be a mesh (e.g., an Ni mesh of FIG. 6) or a ring at the perimeter of the filter. The free-standing areas, therefore, would be the regions of greatest transparency.

Figure 11:
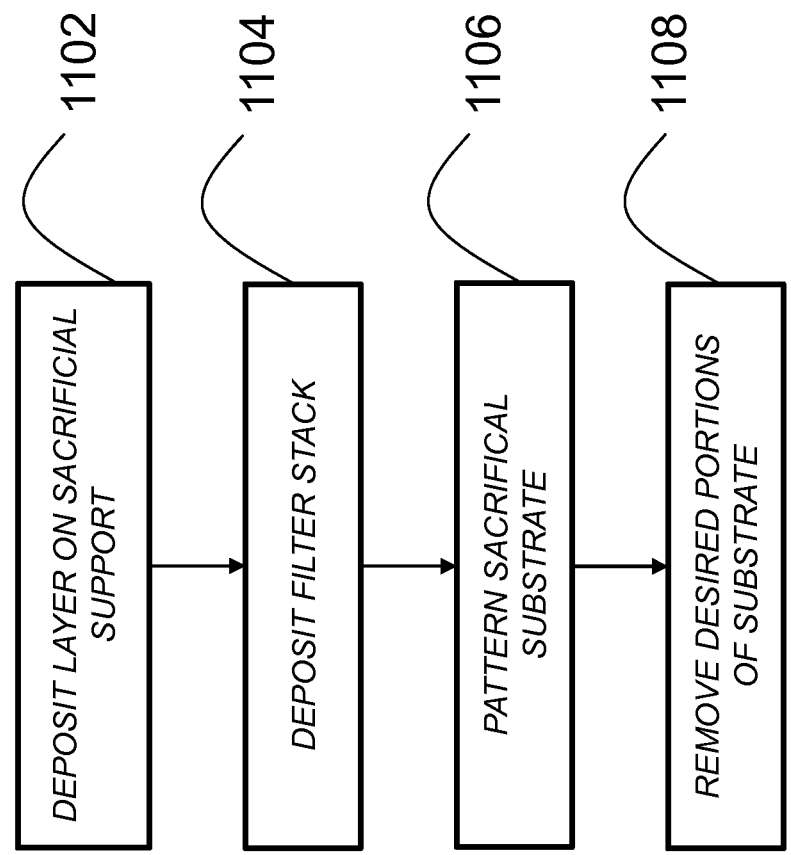
FIG. 11 illustrates an exemplary process for fabricating free-standing thin film filters in accordance with one or more embodiments of the invention.
Figure 12A:
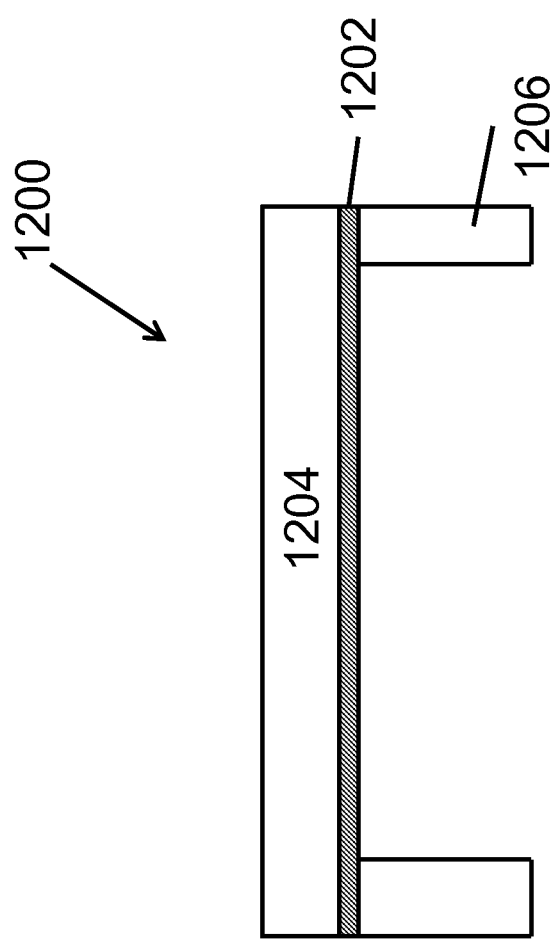
FIG. 12(a) is a cross-sectional schematic of a free-standing filter according to one or more embodiments of the present invention.
Figure 12B:
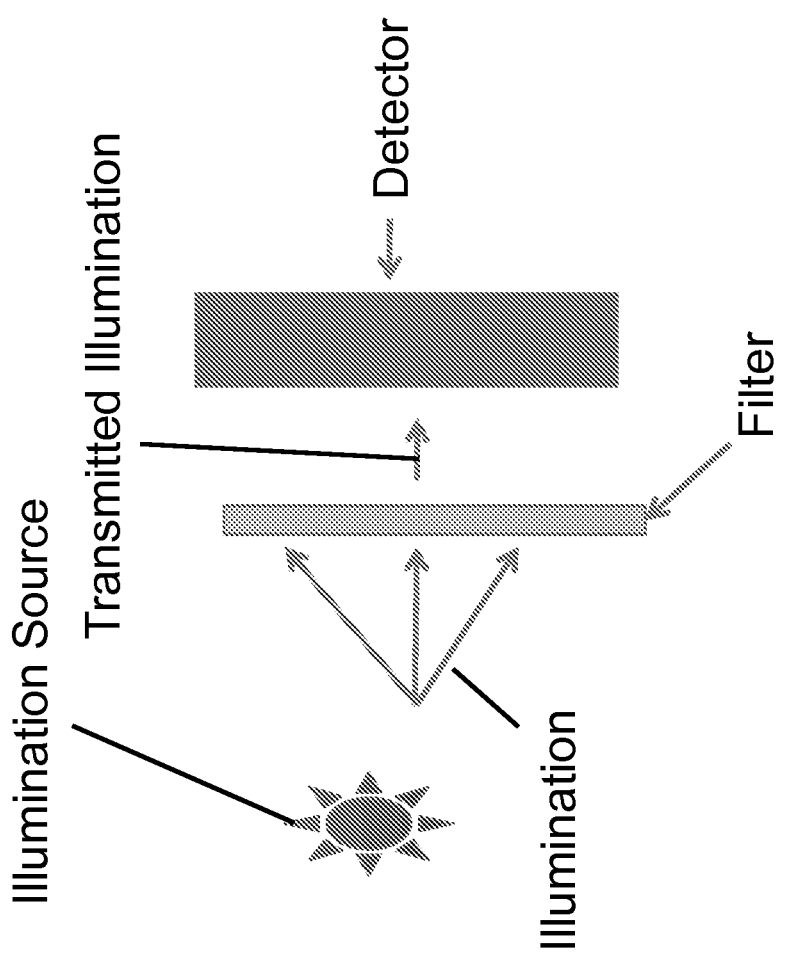
FIG. 12(b) is a cross-sectional schematic of the set up for using the free-standing filter, showing illumination, filter, illumination transmitted by the filter (transmitted illumination), and detector, according to one or more embodiments of the invention.
Figure 12C:
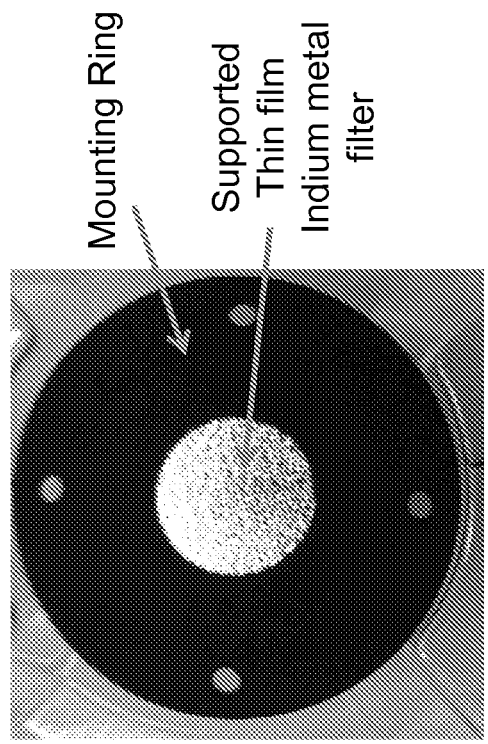
FIG. 12(c) is a top view photograph of a packaged free standing filter showing mounting ring and supported thin film indium metal filter, according to one or more embodiments of the invention.
Figure 12D:
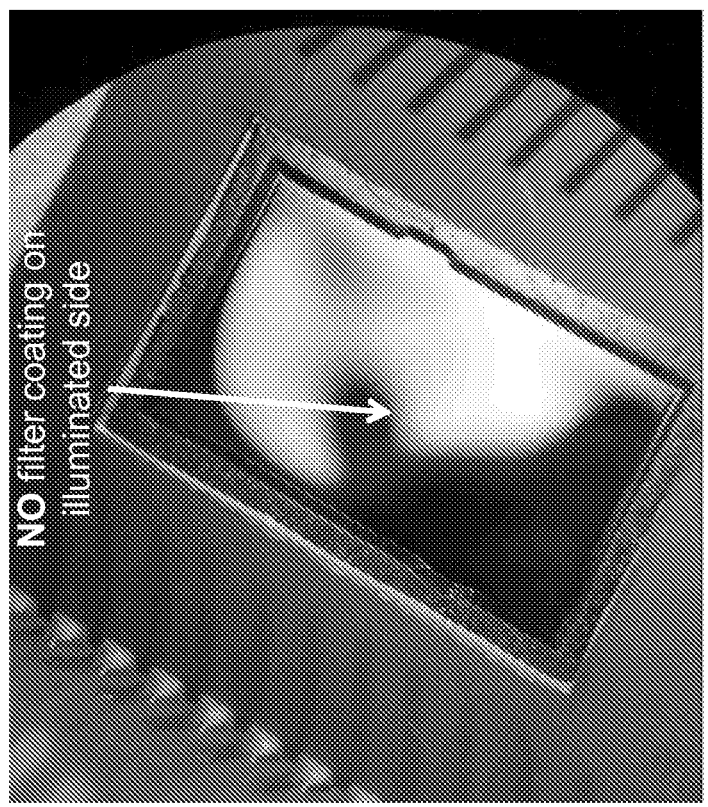
FIG. 12(d) is a bottom view photograph of a packaged CCD showing no filter coating on the illuminated side, wherein the CCD is used with a free standing filter according to one or more embodiments of the invention.

FIG. 11 illustrates an exemplary process for fabricating free-standing thin film filters in accordance with one or more embodiments of the invention.

At step 1102, an atomically thin etch stop layer (e.g., 10 angstroms thick aluminum oxide deposited by ALD at 300° C. deposition temperature, using aluminum precursor and ozone) is deposited on the sacrificial support or substrate (e.g., silicon wafer). The stop layer may and sufficiently thick to protect the filter from a process that removes the sacrificial substrate and sufficiently thin to be transparent. Alternatively, a stop layer used in substrate lift off may be used. The present invention is not limited to particular thicknesses or materials for stop layers. A transparency of the stop layer may be 10% or greater (i.e., the stop layer transmits 10% or greater of the electromagnetic radiation) at one or more frequencies of a pass band or desired wavelengths of the filter—i.e., if the filter is designed to pass or transmit a first range of frequencies or wavelengths of the electromagnetic radiation, and block a second range of frequencies or wavelengths of the electromagnetic radiation, the stop layer has a transparency of 10% or more at one or more frequencies or wavelengths in the first range.

At step 1104, the filter material (e.g., filter stack) is deposited on or above the stop layer. For example, using ALD, Aluminum and Magnesium Fluoride multilayers may be deposited at 250° C. using aluminum precursor and hydrogen for the Al, and a deposition temperature of 350° C. using magnesium precursor and fluorine precursor for the $MgF_2$. Alternatively, the filter may comprise one or more indium layers (deposited, e.g., a 200° C. using indium precursor, ozone, then hydrogen), or one or more magnesium layers (deposited, e.g., at 300° C. using magnesium precursor and hydrogen).

At step 1106, the sacrificial substrate is patterned for a support structure (e.g., using photoresist, lithography pattern of a mesh).

At step 1108, the desired portions of the sacrificial substrate are removed (e.g., via plasma etching using fluorine chemistry, $XeF_2$ etching, etc.) or the film is lifted off the substrate. The step may comprise thinning the sacrificial substrate so that the filter is a free standing film. The thinning may comprise etching holes in the substrate down to the filter to form the substrate into a mesh that mechanically supports the optical filter. Thus, the step may comprise at least partially removing the sacrificial substrate up to the stop layer to form the filter, so that one or more thicknesses of one or more regions of the filter are sufficient to support the filter. The sacrificial substrate may be formed into a mesh or perimeter supporting the filter in the free-standing form.

Other potential deposition techniques, besides ALD, that could also be used to deposit thin film filters are molecular beam epitaxy and thermal evaporation, but are not limited to these.

FIG. 12(*a*) illustrates a filter 1200 for electromagnetic radiation fabricated using above method, comprising a stop layer 1202 for removing a sacrificial substrate 1204, wherein the stop layer 1202 is transparent to the electromagnetic radiation; and filter material 1200 on or above the stop layer 1202, wherein one or more thicknesses 1204 of one or more regions of the filter 1200 are sufficient to support the filter 1200 (e.g., in a free-standing form). The one or more regions of the filter 1200 may comprise the sacrificial substrate 1204 formed into a mesh or perimeter or ring 1206 supporting the filter.

FIG. 12(*b*) illustrates the set up for using the free-standing filter, showing illumination, filter, illumination transmitted by the filter (transmitted illumination), and detector.

FIG. 12(*c*) is a top view of a packaged free standing filter showing mounting ring and supported thin film indium metal filter. A close up of the indium metal filter is shown in FIG. 6.

FIG. 12(*d*) is a bottom view of a packaged CCD showing no filter coating on the illuminated side, wherein the CCD is used with a free standing filter.

Process Steps for Plasma Treatment to Existing Filters

ALD or plasma treatment processes can also be used to improve existing filters. Plasmas enable low temperature surface treatments that can be used to remove impurities (such as carbon) from thin film stacks. An example of such a plasma process utilizes a gas mixture of argon and hydrogen. Process parameters may include Argon %, Methane %, Hydrogen %, Pressure, Power, and exposure time, for example.

Figure 13:
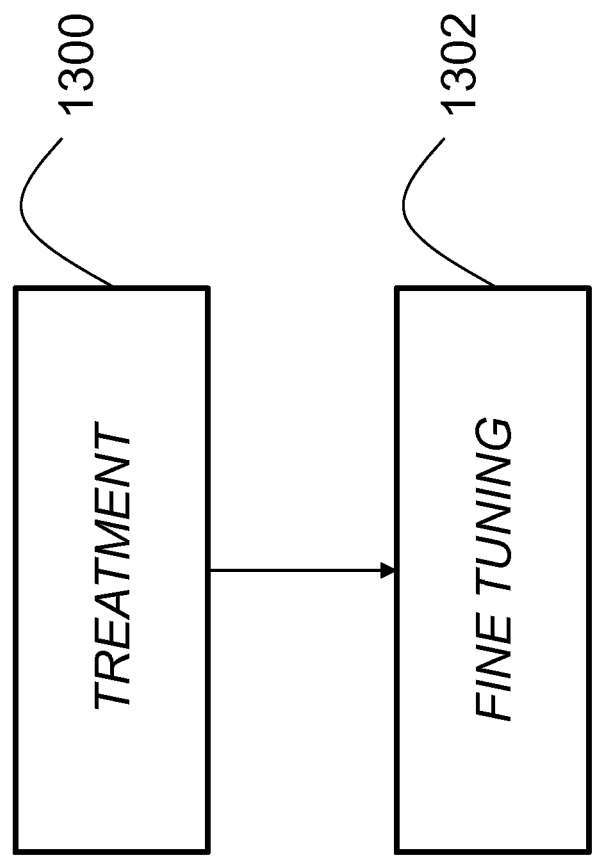
FIG. 13 illustrates an exemplary process for treating and removing contaminants from existing filters, according to one or more embodiments of the present invention.

FIG. 13 illustrates such a treatment.

Block 1300 represents treating an existing or fabricated filter (fabricated independently by any method) with one or more plasmas to improve the fabricated filter's properties, e.g., to remove undesired contaminants from the filter that reduce transmission at one or more frequencies of the transmitted radiation (if the filter is designed to pass or transmit a first range of frequencies or wavelengths of the electromagnetic radiation, and block a second range of frequencies or wavelengths of the electromagnetic radiation, the treatment removes undesired contaminants that reduce transmission at one or more frequencies in the first range). The treating may remove absorbing materials from the optical filter that absorb at the wavelengths of light transmitted by the filter. The treating may improve the filter's transmission at one or more frequencies of the transmitted radiation (if the filter is designed to pass or transmit a first range of frequencies or wavelengths of the electromagnetic radiation, and block a second range of frequencies or wavelengths of the electromagnetic radiation, the treatment improves transmission at one or more frequencies in the first range).

The treating is under conditions that do not destroy the detector and which improve performance of the filter and the device. FIGS. 7(*a*)-(*c*) illustrate results of the above treatment step.

Block 1302 represents fine tuning transmission of the filter comprising a material, by depositing additional layers of the material on the filter atomic layer by atomic layer.

Blocks 1300-1302 may be performed independently and/or optimized.

Exemplary plasma conditions may include using an Argon % of 72%, a Hydrogen % of 28%, a pressure of 80 mTorr, a power of 40 W, and an exposure time of 20 minutes. However, other conditions and constituents may be used.

ALD can be utilized to fine tune filter performance by depositing additional layers of the same material (e.g. additional indium metal to an indium filter fabricated by other means) or adding new materials to an existing filter (e.g. adding aluminum and magnesium fluoride layers to an indium filter).

Possible Modifications and Variations

The filters of the present invention may be a high pass, low pass, or band pass filter, for example.

The present invention is not limited to deposition of filters on detectors or particular detectors. The detector device may include a photomultiplier, microchannel plate, or imager, for example.

The present invention may deposit filters on other devices fabricated from a wide range of materials, e.g., semiconductor devices, so that the substrate for the filter is a device.

However, the present invention is not limited to the fabrication of anti-reflective coatings or filters. Any device that benefit from coatings may be fabricated, including, for example, superconducting detectors, optical elements (mirrors/filters), surface passivation, and other surface treatments.

The present invention relates to surface and interface engineering via ALD and plasma treatment processes, to enable high performance materials, detectors, and instruments.

REFERENCES

The following references are incorporated by reference herein:

[1] Lee et al. Electrochemical and solid-state letters 2002, vol. 5, n 10, pp. C91-C93.

[2] Pilvi et al. J. Mater. Chem., 2007, 17, 5077-5083.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a filter for electromagnetic radiation, comprising:
   growing a filter as a film comprising one or more materials and under growth conditions, on or above a surface of a substrate comprising a detector, wherein:
   the film has a thickness with a thickness uniformity and thickness accuracy of 5% or less,
   a transparency of the film is 10% or greater at one or more frequencies in a pass band of the filter, and
   the detector is for receiving and detecting the electromagnetic radiation transmitted through the filter ("transmitted radiation").

2. The method of claim 1, wherein the growing comprises controlling the thickness of the filter with atomic layer precision.

3. The method of claim 2, wherein the growing comprises:
   depositing one or more atomic monolayers of an insulating layer or a barrier layer on the surface; and
   depositing the filter on the insulating layer or barrier layer.

4. The method of claim 3 wherein the insulating layer or barrier layer is aluminum oxide and the detector is a silicon imager.

5. The method of claim 2, wherein the filter comprises aluminum and magnesium fluoride multilayers.

6. The method of claim 1, wherein the thickness and one or more material qualities of the filter are such that the filter reduces a flux of the electromagnetic radiation at Lyman-alpha frequencies by a factor of at least while at least $10^{-4}$, while at least 10% of the electromagnetic radiation having a wavelength between 900 Angstroms and 1100 Angstroms is transmitted through the filter.

7. The method of claim 1, wherein the growing comprises depositing the filter by Atomic Layer Deposition (ALD) on or above the surface.

8. The method of claim 1, further comprising:
   treating the filter with a plasma to remove undesired contaminants from the filter that reduce transmission at one or more frequencies of the transmitted radiation.

9. A method of fabricating a filter for electromagnetic radiation, comprising:
   depositing a stop layer on a sacrificial substrate, wherein a transparency of the stop layer is 10% or greater at one or more frequencies in a pass band of the filter;
   depositing filter material on or above the stop layer; and
   at least partially removing the sacrificial substrate up to the stop layer to form the filter, so that one or more thicknesses of one or more regions of the filter are sufficient to support the filter.

10. The method of claim 9, wherein the sacrificial substrate is formed into a mesh or perimeter supporting the filter in the free-standing form.

11. The method of claim 9, wherein the stop layer is deposited by Atomic Layer Deposition (ALD).

12. The method of claim 1, further comprising treating the fabricated filter with one or more plasmas to improve one or more of the fabricated filter's properties.

13. The method of claim 12 wherein the treating increases transmission at one or more frequencies of the electromagnetic radiation transmitted through the filter.

14. The method of claim 1, wherein the growing is by molecular beam epitaxy.

15. The method of claim 1, wherein the growing is by thermal evaporation.

16. The method of claim 1, wherein the conditions are such that a surface of the film is conformal to the surface of the detector over an entire sensing area of the detector.

17. The method of claim 1, wherein the thickness uniformity, the thickness accuracy, and density variations of the filter, are <2%.

18. The method of claim 1, wherein the thickness uniformity, thickness accuracy, and the density variations are over an entire sensing area of the detector.

19. The method of claim 1, wherein the thickness uniformity and thickness accuracy are over an entire sensing area of the detector.

20. The method of claim 1, further comprising controlling one or more of a density, impurity concentration, phase, stochiometry, index of refraction, and composition of the filter, to obtain the transparency.

21. The method of claim 1, wherein the conditions do not deteriorate or destroy the detector.

22. The method of claim 1, wherein the growth conditions include growing the filter at a temperature below a maximum temperature that depends on the detector.

23. The method of claim 1, wherein the filter comprises one or more indium layers.

24. The method of claim 1, wherein the filter comprises one or more magnesium layers.

* * * * *